United States Patent [19]

Neugebauer et al.

[11] Patent Number: 4,769,744

[45] Date of Patent: Sep. 6, 1988

[54] SEMICONDUCTOR CHIP PACKAGES HAVING SOLDER LAYERS OF ENHANCED DURABILITY

[75] Inventors: Constantine A. Neugebauer, Schenectady; Richard O. Carlson, Scotia, both of N.Y.

[73] Assignee: General Electric Company, Schenectady, N.Y.

[21] Appl. No.: 851,275

[22] Filed: Apr. 10, 1986

Related U.S. Application Data

[63] Continuation of Ser. No. 520,368, Aug. 4, 1983, abandoned.

[51] Int. Cl.$^4$ .............................................. H05K 7/20
[52] U.S. Cl. ..................................... 361/386; 357/79; 357/81
[58] Field of Search ................... 165/80.3, 86 B, 80.4, 165/80 C, 185; 174/16 HS; 338/316; 339/30; 357/81, 79; 361/385, 386, 388, 389, 396, 400, 413

[56] References Cited

U.S. PATENT DOCUMENTS

| | | | |
|---|---|---|---|
| 2,825,014 | 2/1958 | Willemse | 357/79 |
| 3,218,524 | 11/1965 | Reintgen et al. | 357/81 |
| 3,248,615 | 4/1966 | Weisshaar et al. | 357/81 |
| 3,293,509 | 12/1966 | Emeis | 357/81 |
| 3,378,735 | 4/1968 | Emeis | 357/81 |
| 3,858,096 | 12/1974 | Kuhrt et al. | 357/81 |
| 3,969,754 | 7/1976 | Kuniya et al. | 357/81 |
| 4,129,243 | 12/1978 | Cusano et al. | 228/122 |
| 4,381,032 | 4/1983 | Cutchaw | 165/46 |
| 4,402,004 | 8/1983 | Iwasaki | 357/79 |
| 4,558,510 | 12/1985 | Tani | 29/588 |

OTHER PUBLICATIONS

Dumaine et al., "Circuit Package, "IBM Technical Disclosure Bulletin", vol. 21, No. 7 12/78 p. 2852.
"Feature Products," EDN issue of 16 Sep. 1981 at p. 215.
R. O. Carlson et al., "Thermal Design for Power Seimconductor Packages," 82CRD264 (Oct. 1982), 10 pages.
R. T. Howard, "Optimization of Indiun-Lead Alloys for Controlled Collapse Chip Connection Application," IBM J. Res. Develop., vol. 26, No. 3, May 1982 pp. 372-378.
R. C. Chu et al., "Conduction Cooling for an LSI Package: A One-Dimensional Approach," IBM J. Res. Develop., vol. 26, No. 1 (Jan. 1982), pp. 45-54.
S. Oktay et al., "A Conduction Cooled Module for High-Performance LSI Devices," IBM J. Res. Develop., vol. 26, No. 1, (Jan. 1982), pp. 55-66.

*Primary Examiner*—G. P. Tolin
*Assistant Examiner*—Gregory D. Thompson
*Attorney, Agent, or Firm*—Robert Ochis; James C. Davis, Jr.; Marvin Snyder

[57] ABSTRACT

Solder layers in a semiconductor chip package, which electrically interconnect conductors used to gain electrical access to the electrodes on the semiconductor chip, are subjected to a transverse compressive force in excess of about 2 pounds per square inch. The semiconductor chip package can thereby undergo a marked increase in the number of cycles of heating and cooling before it fails due to increased thermal resistance arising from structural degradation of the solder layers.

18 Claims, 6 Drawing Sheets

SEMICONDUCTOR CHIP PACKAGES HAVING SOLDER LAYERS OF ENHANCED DURABILITY

This application is a continuation of application Ser. No. 520,368, filed Aug. 4, 1983, now abandoned.

BACKGROUND OF THE INVENTION

Our invention relates to packages for semiconductor chips in which solder layers are utilized to electrically interconnect conductors used to gain electrical access to the electrodes on the semiconductor chips. More particularly, our invention relates to packages including such solder layers for power semiconductor chips or signal semiconductor chips.

A "power" semiconductor chip (hereinafter, simply "power chip"), as distinct from a "signal" semiconductor chip (discussed below), such as employed in a digital watch, generates waste heat during operation, typically in excess of about one watt. This heat must be removed lest the chip become overheated and damaged. For removing waste heat from a power chip, a typical prior art power chip package includes a metallic baseplate upon which the power chip is "thermally mounted," that is, attached to the baseplate with material of high thermal conductivity. The baseplate, in turn, is adapted to be mounted upon a metallic heat sink, typically of larger surface area than the metallic baseplate to provide rapid heat dissipation. To provide electrical access to the power chip, a metallic lead is connected to an integrally-formed electrode located on, for example, the upper side of the power chip via a solder layer, with any further integrally-formed electrodes on the upper surface of the power chip being connected to respective further leads via respective solder layers. An integrally-formed electrode on the lower side of the power chip is similarly connected to a lead via a solder layer if the power chip is electrically isolated from the metallic baseplate upon which it is mounted by a dielectric plate. Conversely, the metallic baseplate itself can serve as an electrical lead if the power chip is directly connected to it.

During typical operating cycles of the prior art power chip package, which involves heating (during conduction) and cooling (during non-conduction), the solder layers of the package are mechanically stressed, we believe, because the metallic baseplate (typically of copper) tends to thermally expand and contract to a much larger extent than the power chip (typically of silicon). Accordingly, after repeated thermal cycling of the power chip package, the solder layers become structurally degraded and thus less efficient at transferring waste heat away from the power chip. After continued thermal cycling of the power chip package, the solder layers degrade to a point where they are incapable of adequately transferring waste heat away from the power chip, with the result that the power chip overheats and undergoes damage.

Signal semiconductor chips (hereinafter, simply "signal chips") typically encounter thermal cycling during use. A signal chip may be used, for example, in an aircraft near the fuselage. At ground level, the temperature of such signal chip may reach about 100° C., while at 70,000 feet altitude, the chip temperature is typically about −40° C. We believe that such thermal cycling results in mechanical stress being imposed on solder layers utilized in a typical prior art package containing the signal chip, which solder layers electrically connect the conductors of a signal chip carrier, on which the signal chip is mounted, to conductors of a printed-circuit board, which typically accomodates many signal chip carriers. The mechanical stresses on the solder layers would then be responsible for premature failure of the signal chip package due to mechanical deterioration of the solder layers.

SUMMARY OF THE INVENTION

Accordingly, an object of our invention is to provide a power chip package of the type having electrical leads attached to a power chip via solder layers in which package the solder layers exhibit enhanced durability.

A further object of our invention is to provide a power chip package including a power chip that is capable of operating at a higher current level after an extended number of thermal cycles than a similar power chip that is included in a prior art power chip package.

Another object of our invention is to provide a signal chip package of the type including solder layers, a signal chip carrier, and a printed-circuit board in which the solder layers exhibit enhanced durability.

In brief summary in accordance with a preferred embodiment of our invention directed to a power chip, we provide a power chip package including a metallic baseplate with a power chip thermally mounted thereon and further including a housing mounted on the baseplate and at least partially enclosing the power chip. For providing external electrical access to the power chip, a plurality of electrical leads are respectively connected to integrally-formed electrodes of the power chip via respective solder layers. The power chip package further includes a pressure means for applying a transverse compressive force on the solder layers in excess of about 2 pounds per square inch. Solder layers subjected to such a transverse force exhibit a markedly enhanced durability. A suitable pressure means for applying the transverse compressive force on the solder layers comprises resilient means such as a spring, by way of example.

In accordance with a preferred embodiment of our invention directed to a signal chip, we provide a signal chip package including a printed-circuit board with a plurality of conductors thereon and a signal chip carrier having a plurality of conductors thereon and being disposed above the printed-circuit board. A plurality of solder layers are disposed between the printed-circuit board and the signal chip carrier and respectively interconnect electrically the conductors on the signal chip carrier to the conductors on the printed-circuit board. A pressure means, such as a spring, engages the signal chip carrier and the printed-circuit board and applies a sufficient compressive force between the signal chip carrier and the printed-circuit board so as to result in a transverse compressive force on the solder layers in excess of about 2 pounds per square inch.

BRIEF DESCRIPTION OF THE DRAWINGS

Although the specification concludes with claims particularly pointing out and distinctly claiming the subject matter which we regard as our invention, it is believed that the invention, together with further objects and advantages thereof, will be better understood from the following description, when read in conjunction with the following drawing figures, in which:

DESCRIPTION OF THE PREFERRED EMBODIMENTS

Figure 1:
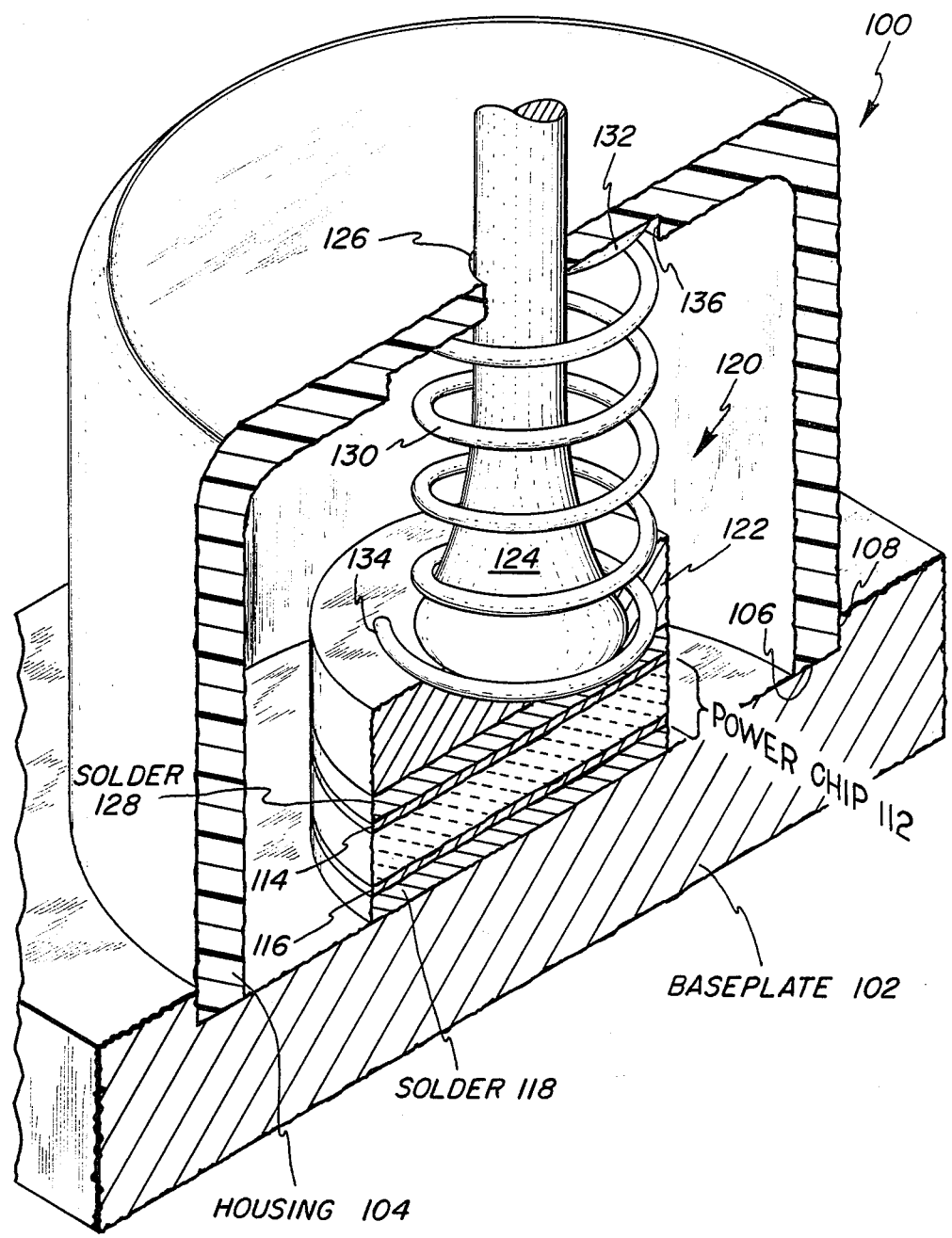
FIG. 1 is a three-dimensional view, partly in cross section, of a power chip package in accordance with our invention, with solder layers thereof shown as greatly enlarged.

Turning to FIG. 1, there is shown in partial cross section a power chip package 100 in accordance with our invention. Package 100 includes a metallic baseplate 102, preferably of copper, and a housing 104, preferably of an epoxy, secured to baseplate 102 at an interface 106, as with epoxy (not shown), interface 106 preferably being disposed in well 108 of baseplate 102.

Secured to the upper surface of baseplate 102 is a power chip 112, such as a diode having upper and lower integrally-formed electrodes 114 and 116, respectively. It is preferable that lower electrode 116 constitute a molybdenum or tungsten backing plate for power chip 112, which backing plate protects power chip 112 from cracking. Power chip 112 is bonded to baseplate 102 by solder layer 118, which is electrically conductive so that baseplate 102 is electrically active and constitutes an electrical lead or terminal of power chip package 100. An upper lead or terminal 120 of package 100, preferably of copper, comprises a rigid, generally-planar plate-like portion 122 with a shank 124 integrally attached to portion 122, extending vertically upward therefrom, and passing through slot 126 in housing 104. Upper terminal 120 is electrically connected to upper electrode 114 of power chip 112 by a solder layer 128. Solder layers 118 and 128 are shown with exaggerated thickness for ease of viewing.

The structure from baseplate 102 through plate-like portion 122 is a stratified or layered structure in which adjacent layers are bonded to each other to form a single unit.

In accordance with our invention, we provide a spring 130, preferably of steel, which is coiled around shank 124 in a generally spiral fashion with its upper end 132 biased against housing 104 and its lower end 134 biased against plate-like portion 122. Spring 130 is effective to transmit to solder layers 118 and 128, via plate-like portion 122, a transverse compressive force upon each of solder layers 118 and 128, such force preferably being orthogonal to the respective layers 118 and 128. We prefer that the transverse compressive force thus applied to solder layers 118 and 128 have a magnitude in excess of about 2 pounds per square inch.

It is preferable that the spring upper end 132 be received within a downwardly opening recess 136 in housing·104 so as to maintain alignment of spring 130 about shank 124. Shank 124 is shown as substantially filling the inner radius of spring 130 near the spring lower end 134 to also help maintain alignment of spring 130, although other techniques for maintaining the alignment of spring 130 about shank 124 will be apparent to those skilled in the art.

In order for spring 134 to be effective in producing the desired transverse compressional force, shank 124 of upper lead 120 should be able to move vertically with respect to slot 126 in housing 104. In an alternative arrangement (not shown), a portion of shank 124 between plate-like portion 122 of upper lead 120 and the upper portion of housing 104 comprises a flexible, conductive member, such as a braided copper conductor. In such alternative arrangement, the upper portion of housing 124 can be secured with slot 126 in housing 104.

Solder layers 118 and 128, with a transverse force applied to them as described above, are markedly more durable than would be the case in the absence of such transverse compressive force. Without wishing to be bound by the following theory of explanation, we postulate that such transverse compressive force on solder layers 118 and 128 serves to prevent cracks in solder layers 118 and 128 from developing in the shear or horizontal direction due to shear forces acting on solders layers 118 and 128 during thermal cycling. Such shear forces, we believe, result from metallic baseplate 102 and plate-like portion 122, both typically of copper, thermally expanding and contracting to a much larger extent than power chip 112, typically of silicon. Alternately, if such shear cracks develop, we postulate that the transverse compressive force applied to the solder layers helps to anneal, or repair, the cracks when the solder layers are allowed to cool from a high operating temperature.

We have found that the greater the transverse compressive force on solder layers 118 and 128, the more durable such solder layers are. A primary indicator of the durability of solder layers 118 and 128 is the value of thermal resistance of power chip package 100 as measured from power chip 112 to baseplate terminal 102. This thermal resistance increases in value as solder layers 118 and 128 become structurally degraded during thermal cycling. The increase in thermal resistance of power chip package 100 as a function of the number of thermal cycles it experiences is plotted in FIG. 2 for various transverse compressive loads on solder layers 118 and 128.

Figure 2:
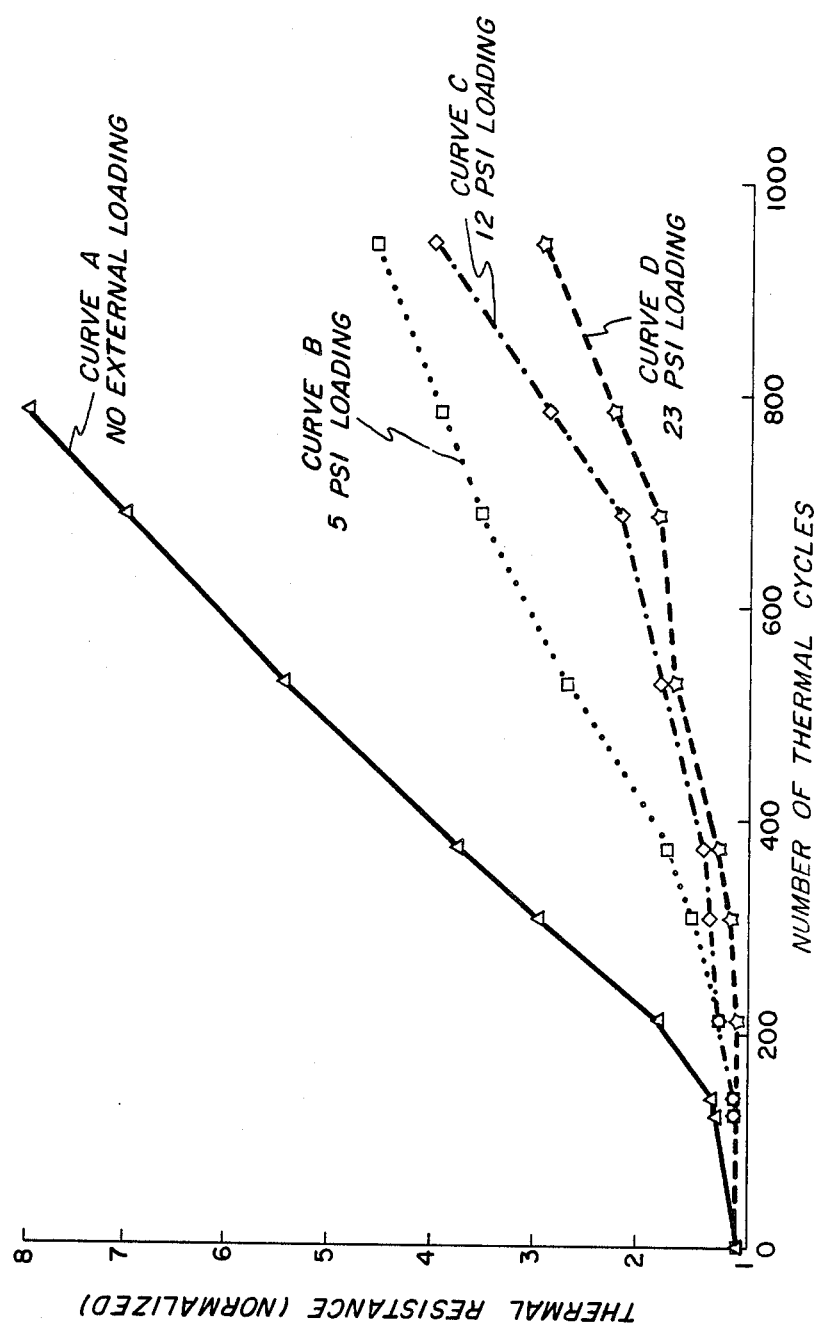
FIG. 2 is a graph of thermal resistance of the power chip package of FIG. 1 versus the number of thermal cycles experienced by the package.

The thermal resistance of FIG. 2 is normalized to unity at zero thermal cycles, with each thermal cycle constituting the maintaining of power chip package 100 at $-40°$ C. for 0.5 hours and then at $140°$ C. for 0.5 hours. FIG. 2 shows the thermal resistance of power chip package 100 for several hundreds of thermal cycles, such as is typically encountered in reliability testing of power chip packages. In FIG. 2 with regard to curve A, it can be appreciated that with no external loading on solder layers 118 and 128, the thermal resistance of power chip package 100 reaches a normalized value of 8 after 800 thermal cycles. With regard to curves B, C, and D, however, pertaining to loading of solder layers 118 and 128 with orthogonal transverse compressive forces of, respectively, 5, 12 and 23 pounds per square inch, the thermal resistance of package 100 reaches only a normalized value of 4 or less. It is reasonable to extrapolate from this data of FIG. 2 that a significant increase in durability of solder layers 118 and 128 will result at a transverse compressive loading of only about 2 pounds per square inch. In FIG. 2 it can be further only appreciated that the higher the loading on solder layers 118 and 128, the lower the observed increase in thermal resistance of package 100. However, to obtain the most economical power chip package, we prefer that the maximum compressive loading on solder layers 118 and 128 be about 50 pounds per square inch.

Figure 3:
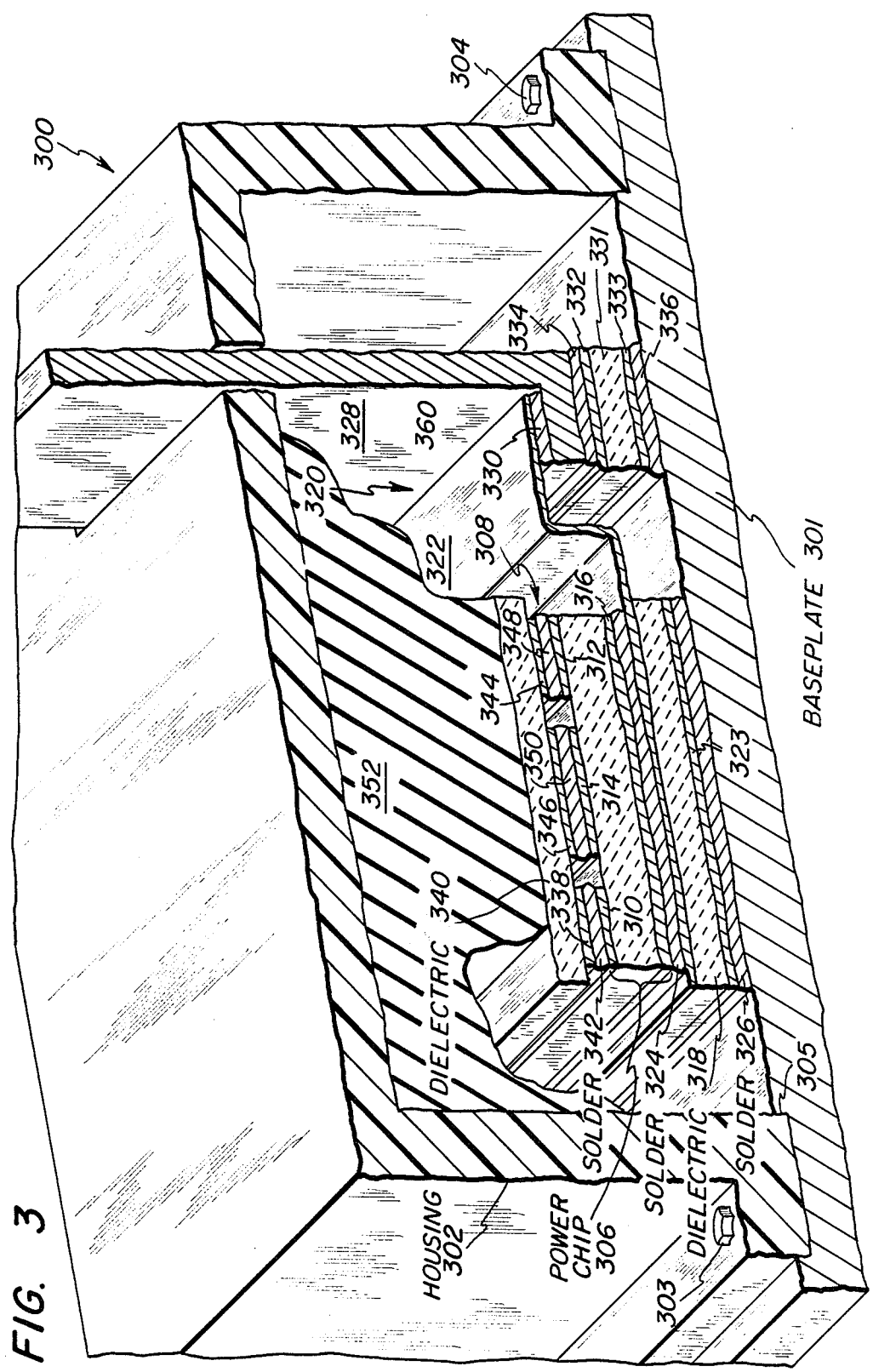
FIGS. 3-5 are views similar to FIG. 1 illustrating further power chip packages in accordance with further embodiments of our invention.

Considering now FIG. 3, there is shown a power chip package 300 in accordance with a further embodiment of our invention, which is particularly well suited for packaging broad area power devices. Package 300 comprises a metallic baseplate 301, preferably of copper, and a housing 302 preferably of epoxy. Housing 302 is secured to baseplate 301 with any suitable fastening means, such as with bolts 303 and 304, and is preferably received within a well 305 of baseplate 301.

Enclosed by housing 302 is a power chip 306, which may comprise, for example, a power Darlington transistor having integrally-formed upper electrodes 308 constituting, at the left and right sides of chip 306, respectively, a pair of base electrodes 310 and 312, and an emitter electrode 314 disposed therebetween. Power chip 306 further comprises an integrally-formed lower electrode 316 constituting a collector electrode. Collector electrode 316 is electrically isolated from baseplate 301 via a dielectric plate 318 of a material of high thermal conductivity, such as the ceramic beryllia or alumina. An electrical lead or terminal 320 is provided for making electrical contact to collector electrode 316 from the exterior of housing 302.

Included in lead structure 320 is a metallic sheet 322, such as copper, having a portion bonded to the upper surface of dielectric plate 318, preferably by the use of the eutectic bonding technique known as "direct bonding" and which is discussed, for example, in the following U.S. Patents, which are assigned to the present assignee: U.S. Pat. Nos. 3,766,634 to G.L. Babcock et al. and 3,994,430 to D.A. Cusano et al. Dielectric plate 318 is connected to baseplate 301, as illustrated, via a metallic layer 323, preferably a sheet of copper direct bonded to the underside of dielectric plate 318, and a solder layer 326. Alternatively, dielectric plate 318 could be directly epoxied to baseplate 301.

Further included in lead structure 320 is a terminal post 328, connected to metallic sheet 322 as with solder layer 330 and which is electrically isolated from baseplate 301 via dielectric plate 331 and upper and lower metallic sheets 332 and 333, respectively, preferably of direct bonded copper. Solder layer 334 connects post 328 to upper metallic sheet 332 and solder layer 336 connects lower metallic sheet 333 to baseplate 301.

Upper base electrode 310 of power chip 306 is electrically connected to metallic sheet 338, preferably comprising a copper sheet direct bonded to the underside of a dielectric plate 340. Sheet 338 is connected to a terminal post (not shown) similar to post 328 but which is of less current capacity than post 328. Base electrode 310 is electrically connected to metallic sheet 338 by a solder layer 342.

Upper base and emitter electrodes 312 and 314 of power chip 306 are electrically connected to metallic sheets 344 and 346 by solder layers 348 and 350, respectively, both sheets preferably being similar to metallic sheet 338. Metallic sheets 344 and 346 are connected to respective base and emitter terminal posts (not shown) similar to post 328, with the base terminal post being of less current capacity than post 328. Base electrode 312 is connected to metallic sheet 344 via solder layer 348, and emitter electrode 314 is connected to metallic sheet 346 via solder layer 350.

Transverse compression is exerted upon all the solder layers above and below power chip 306 (i.e., layers 324, 326, 342, 348 and 350). This results from the inclusion within housing 302 of a rubbery material 352 shown partially broken away, such as room temperature vulcanizing silicone rubber, which fills any substantial voids within housing 302. The transverse compression on these solder layers constitutes a hydrostatic pressure which may have two distinct origins. First, housing 302 can be slightly overfilled with rubbery material 352 and allowed to cure prior to securing housing 302 to baseplate 301. Second, rubbery material 352 may be selected to expand at a higher rate than housing 302 while power chip package 300 is raised in temperature, whereby the hydrostatic pressure within housing 302 increases with increasing temperature.

We prefer that rubbery material 352 so expand at a 9reater rate than housing 302 while package 300 is raised in temperature, because greater transverse compression on the various solder layers will then be exerted at the higher temperatures at which the shear stresses on the solder layers are greatest. As is the case with package 100 (FIG. 1), we prefer that the transverse compression exerted on the solder layers in power chip package 300 above and below power chip 306 exceed about 2 pounds per square inch.

The inclusion of dielectric plate 340 in power chip package 300 advantageously serves to render more uniform the transverse pressure applied upon upper solder layers 342, 348 and 350. This is because dielectric plate 340 together with direct bonded metallic sheets 338, 344 and 346 comprises a rigid, generally-planar structure, at least where dielectric plate 340 comprises a typical ceramic, such as beryllia or alumina.

In power chip package 300, it can be appreciated that solder layers 330, 334 and 336, associated with lead structure 320, also are subjected to a transverse compressive force due to the presence of rubbery material 352 within housing 302. Accordingly, the durability of these solder layers is increased, although these solder layers are less subject to thermal stresses than the solder layers above or below power chip 306, which become heated due to power dissipation in power chip 306.

Figure 4:
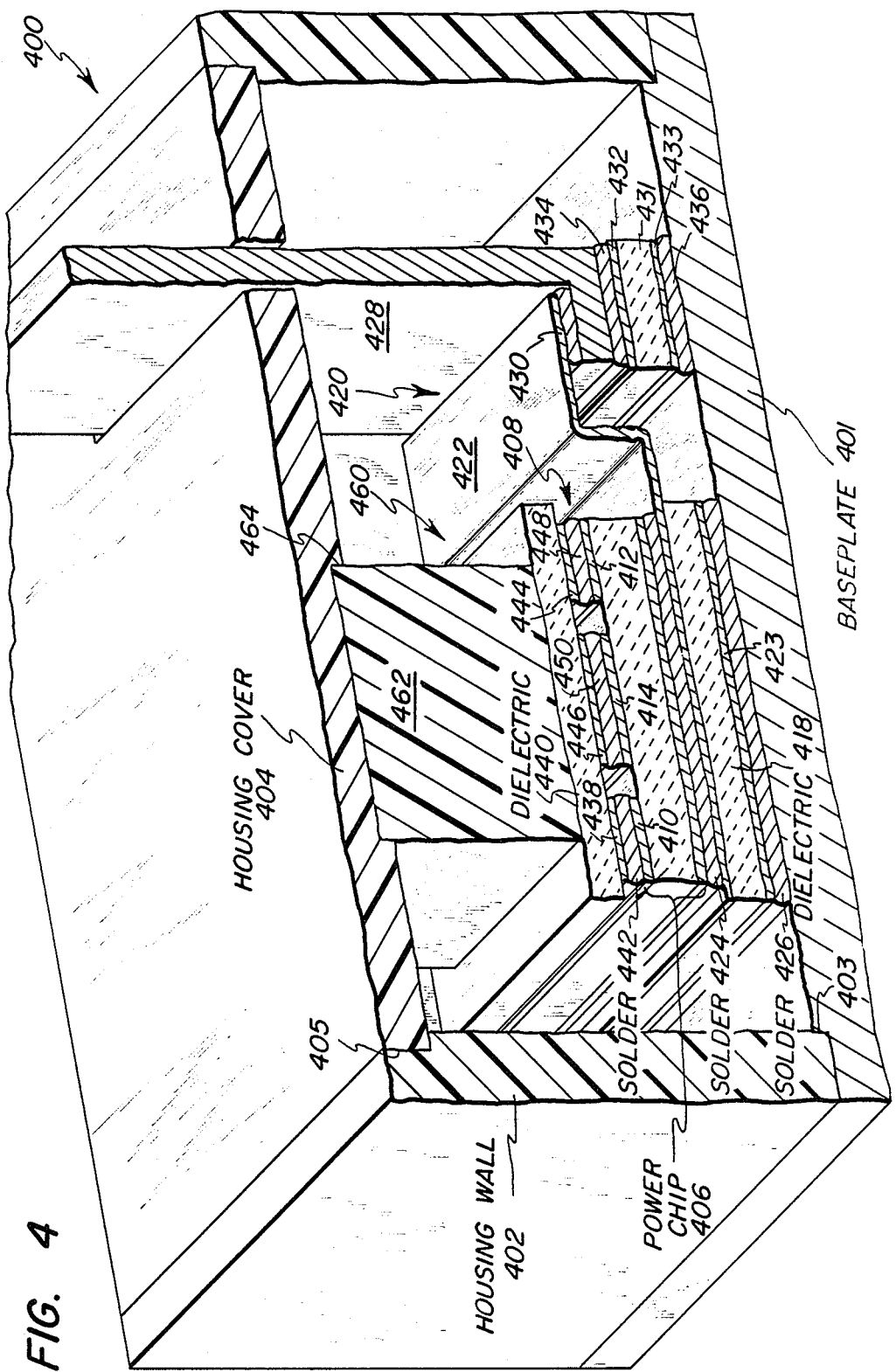

Turning now to FIG. 4, there is illustrated a power chip package 400 in accordance with a further embodiment of out invention. Package 400 includes a metallic baseplate 401, such as copper, a housing wall 402 secured to baseplate 401, preferably in well 403 of baseplate 401, as with epoxy (not shown), and a housing cover 404 secured to housing wall 402, preferably within a groove 405 in wall 402, as with epoxy (not shown). Lead structure 420, secured to baseplate 401, is similar to lead structure 320 of power chip package 300 (FIG. 3) and, thus, the component parts of lead structure 420 have been provided with "400" series reference numerals corresponding to the "300" series numerals of FIG. 3, with the description of each part of lead structure 320 appling to the part of present lead structure 420 having a reference numeral increased by 100. Similarly, power chip assembly 460, within housing wall 402 and housing cover 404 is similar to power chip assembly 360 of power chip package 300 shown in FIG. 3, and, thus, the component parts of assembly 460 are provided with "400" series numerals corresponding to the "300" series numerals of FIG. 3, with the description pertaining to each part of power chip assembly 360 applying to the part of present power chip assembly 460 having a reference numeral increased by 100.

In power chip package 400, a block of material 462 is provided to impart a transverse compressive force to the solder layers above and below power chip 406 (that is, solder layers 424, 426, 442, 448, and 450). The upper portion of block 462 is preferably received within a recess 464 in the underside of housing cover 404 so as to maintain alignment of the block. Block 462 comprises a material such as nylon or Teflon resin (polytetrofluoroethylene) having a coefficient of thermal expansion which is greater than that of housing wall 402. Accordingly, upon heating of power chip package 400, block 462 expands more than housing wall 402, thereby increasing the transverse compressive force imposed upon the solder layers above and below power chip 406. We prefer that block 462 be preloaded, or pressed downwardly, by housing cover 404 when power chip package 400 is assembled. As is the case with power chip package 100 (FIG. 1), we prefer that the minimum transverse compressive force exerted on each of the solder layers above and below power chip 406 be in excess of about 2 pounds per square inch.

Figure 5:
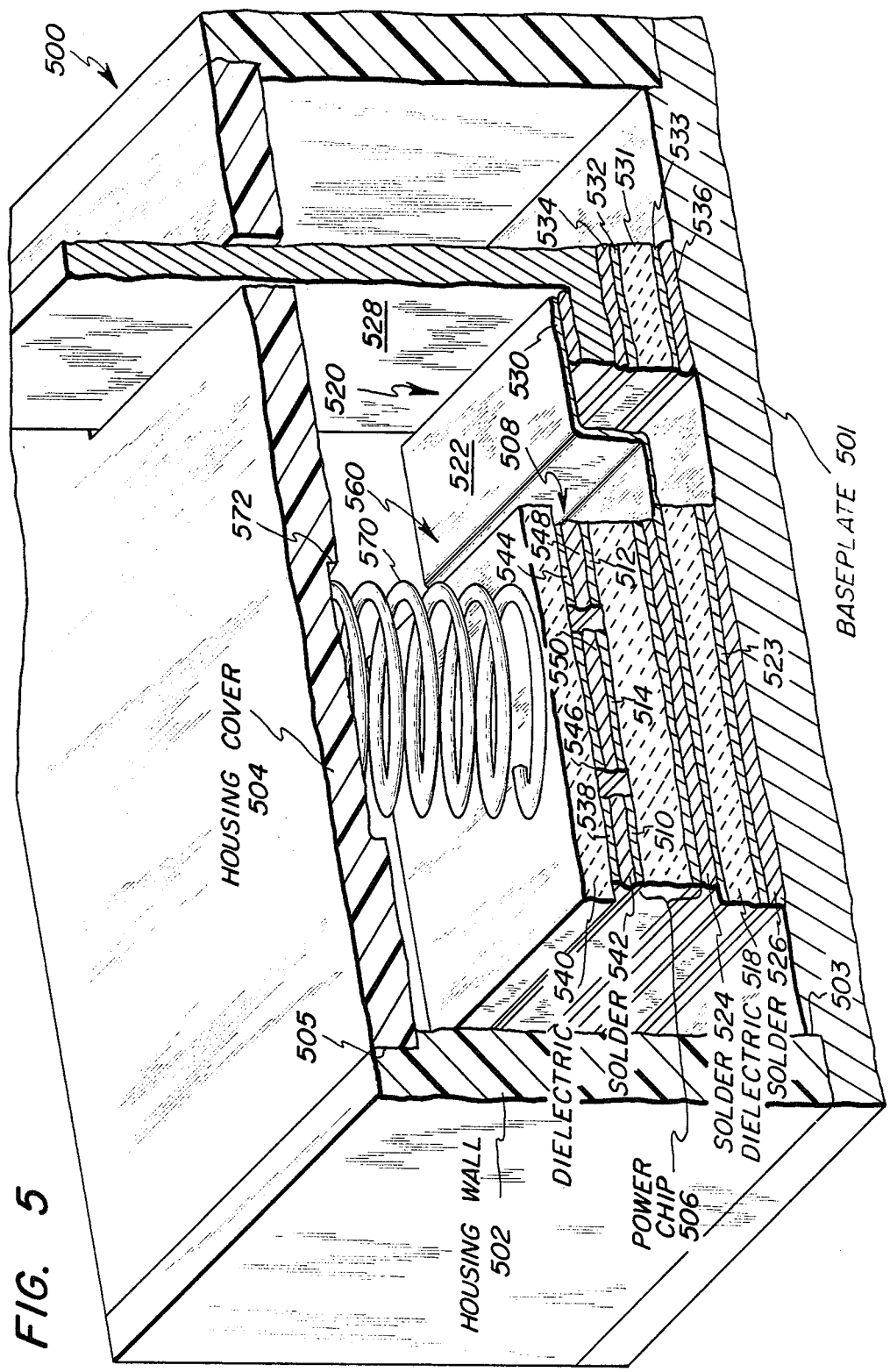

Turning now to FIG. 5, a power chip carrier 500 in accordance with a further embodiment of our invention is illustrated. Carrier 500 is suitably identical in structure to power chip carrier 400 (FIG. 4) except for the inclusion therein of a spring 570 rather than block 462 of package 400, for exerting a transverse compressive force on the solder layers above and below power chip 506. Accordingly, the various parts of package 500 are referenced with "500" series numerals corresponding to the "400" series numerals of FIG. 4, with the description of each part of power chip package 400 (except for block of material 462) applying to the part of present power chip package 500 having a reference numeral increased by 100.

Spring 570 is advantageously received within a recess 572 in the underside of housing cover 504 so as to maintain vertical alignment of the spring. The transverse compressive force exerted by spring 570 on the solder layers above and below power chip 506 is transmitted to such solder layers through dielectric plate 540, and preferably exceeds about 2 pounds per square inch.

In constructing the above-described power chip packages, we prefer that the housings of the packages each comprise an epoxy and that the housings be secured to the respective baseplates by epoxy adhesive. We prefer that both the epoxy housings and the epoxy adhesive comprise an epoxy of the type that can be cured by maintaining it at room temperature (i.e., at about 24° centigrade) for 24 hours, or alternatively, of a type curable by maintaining it at 50° centigrade for 1.0 hours. We prefer that each of the solder layers described herein comprises a "soft" solder; that is, a solder having a melting point below about 400° centigrade. By way of example, a suitable solder comprises Indalloy No. 151 lead-tin solder sold by Indium Corporation of America of Utica, N.Y., which comprises 92.5% lead, 5% tin, and 2.5% silver.

Figure 6:
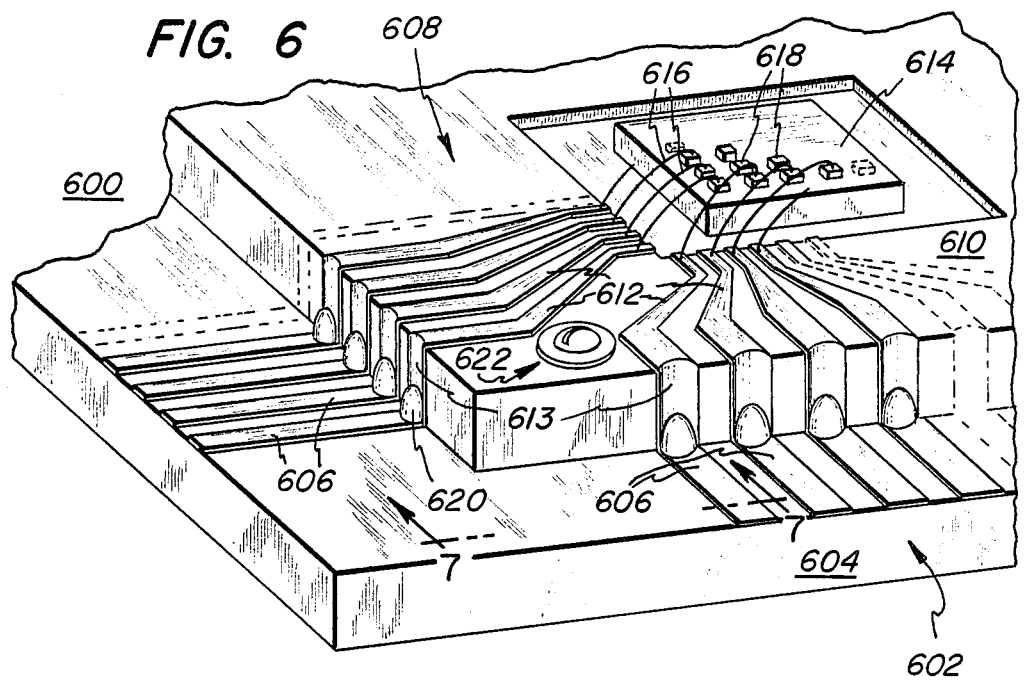
FIG. 6 is a three-dimensional view, partly in cross section, of a signal chip package in accordance with our invention, with solder layers thereof shown greatly enlarged.

Turning now to FIG. 6, there is shown in partial cross section a portion of a signal chip package 600 in accordance with our invention. The illustrated portion of package 600 constitutes a quarter of the complete signal chip package, with the non-illustrated quarters each being essentially alike the illustrated quarter. Package 600 includes a printed-circuit board 602 having a dielectric body 604, typically of plastic, and a plurality of printed conductors 606 thereon.

Package 600 further includes a signal chip carrier 608 having a dielectric body 610, typically of ceramic, and a plurality of conductors 612, typically of thick film construction, thereon. Signal chip carrier 608 may include a castellations or recesses 613 at the peripheral edges of chip carrier body portion 610 in which conductors 612 are disposed. Signal chip carrier 608 "carries" or supports a signal chip 614, with wire bonds 616, suitably of conventional construction, interconnecting electrodes 618 of signal chip 614 to conductors 612 of chip carrier 608.

A plurality of solder layers 620 disposed between signal chip carrier 608 and printed-circuit board 602 electrically interconnect conductors 612 of chip carrier 608 to conductors 606 of printed-circuit board 602, respectively. Solder layers 620 are shown as partially filling castellations 613, as is useful for visually detecting the presence of solder layers 620. Solder layers 620 preferably comprise soft solder (as described above). A pressure means 622, engaging chip carrier 608 and printed-circuit board 602, compresses together carrier 608 and board 602 and results in a transverse force being imposed on solder layers 620 at least for the portions thereof located directly between signal chip carrier 608 and printed-circuit board 602. The details of an exemplary pressure means 622 are depicted in the detail view of FIG. 7 taken at arrows 7—7 in FIG. 6.

Figure 7:
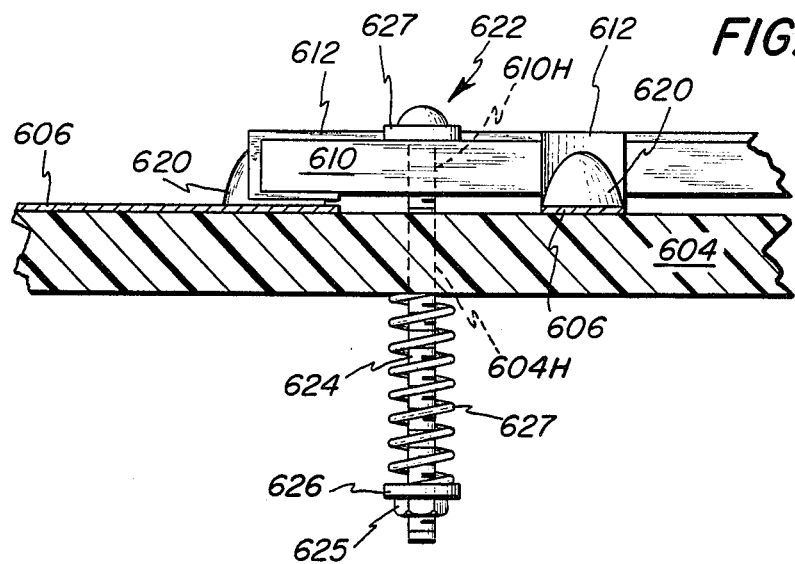
FIG. 7 is a detail view of the pressure means of the signal chip package of FIG. 6 taken at arrows 7—7 in FIG. 6.

In FIG. 7, an exemplary pressure means 622 can be seen to comprise a bolt 624, passing through a hole 610H in chip carrier body portion 610 and a hole 604H in printed-circuit board body portion 604, and a nut 625, with washers 626 and 627 employed at lower and upper ends of bolt 624, respectively. Hole 604H is preferably sufficiently oversized with respect to bolt 624 so that the vertical alignment of chip carrier 608 and printed-circuit board 602 is determined by solder layers 620 rather than bolt 624. This permits some relative horizontal movement between chip carrier 608 and printed-circuit board 602. A spring 627 is spirally coiled around bolt 624 and biases apart printed-circuit board body portion 604 from washer 626. This results in a compressive force being transmitted through bolt 624 to washer 627, which presses together chip carrier body portion 610 and printed-circuit board body portion 604. A transverse compressive force is thereby imposed on solder layers 620, which should be in the same range as the transverse compressive force applied to the solder layers of the above-described power chip packages; that is, in excess of about 2 pounds per square inch, with a preferred maximum value of about 50 pounds per square inch in order to yield the most economical signal chip package 600.

As an alternative to exemplary pressure means 622, a spring clip (not shown), comprising a slightly curved strip of spring steel, for example, could be mounted at one end to printed-circuit board 602, as with a screw, with the other end biased to press downwardly on signal chip carrier 608. Other suitable materials for implementing a spring chip include bronze and copper beryllium alloy, by way of example.

The foregoing describes semiconductor chip packages having solder layers of enhanced durability. In power chip packages, this beneficially permits smaller area power chips to carry more current than previously possible, since the power chip packages of our invention reliably extract high levels of waste heat from such power chips even after numerous cycles of heating and cooling. In signal chip package, this beneficially results in more durability after numerous cycles of heating and cooling.

While our invention has been described with respect to specific embodiments, many modifications and substitutions of our invention will be apparent to those skilled in the art. For example, hybrid semiconductor chip packages for packaging both power chips and signal chips can be fabricated in accordance with our invention. It is, therefore, to be understood that the appended claims are intended to cover all such modifications and substitutions as fall within the true spirit and scope of the invention.

What we claim as our invention and desire to have secured by Letters Patent of the United States is:

1. A packaged semiconductor device, said device having a plurality of electrical contacts, said packaged device comprising:
   a stratified structure comprising:
      a base plate having an upper surface,
      said semiconductor device disposed above said baseplate,
      an electrical lead disposed above one of said contacts which is on the upper surface of said device, and
      a plurality of bonds securing said stratified strucure together as a unit, at least one of said bonds comprising solder and
   means for applying a compressive force of at least 2 pounds per square inch on said bonds of said stratified structure in the direction of layering.

2. The packaged device recited in claim 1 wherein said solder comprises soft solder.

3. The packaged device recited in claim 2 wherein said baseplate is thermally conducting.

4. The packaged device recited in claim 3 wherein said baseplate is metallic.

5. The packaged device recited in claim 4 wherein said stratified structure further includes a layer of dielectric material disposed between said baseplate and said device.

6. The packaged device recited in claim 5 wherein said means for applying provides a continuous compressive force.

7. The packaged device recited in claim 6 wherein said means for applying includes a spring.

8. The packaged device recited in claim 7 wherein said means for applying includes a member holding said spring in a force applying configuration.

9. The packaged device recited in claim 7 wherein said member is a housing attached to said baseplate which holds said spring in a force applying configuration.

10. The packaged device recited in claim 1 wherein said means for applying includes a housing secured to said base plate and at least partially enclosing said device and a spring and said electrical lead comprises:
    a rigid plate-like portion; and
    a shank connected to said plate-like portion and extending upwardly though said housing so as to form a terminal post;
    said shank extending through said spring with a first end of said spring disposed against the upper surface of said plate-like portion and a second end of said spring disposed against said housing.

11. The packaged device recited in claim 2 wherein said means for applying provides an increasing compressive force as the temperature of said device increases.

12. The packaged device recited in claim 11 wherein said means for applying includes a housing secured to said baseplate and at least partially enclosing said device.

13. The packaged device recited in claim 12 wherein said means for applying includes a block of material interposed between said housing and said stratified structure, said block of material having a coefficient of thermal expansion higher than that of said housing, whereby said block thermally expands to a greater extent than said housing whereby said compressive force on said solder layer increases upon heating of said block of material.

14. The packaged device recited in claim 13 wherein said stratified structure includes a rigid, generally planar structure adjoining said solder layer and through which said block of material exerts said compressive force on said solder layer.

15. The packaged device recited in claim 14 wherein said rigid, generally planar structure comprises a ceramic plate having a layer of metal bonded thereto and which adjoins said solder layer.

16. The packaged device recited in claim 15 wherein said block of material comprises nylon or polytetrafluoroethylene resin.

17. The packaged device recited in claim 12 wherein said means for applying comprises a rubbery material which fills any substantial voids within said housing so as to exert a hydrostatic compressive force on said solder layer.

18. The packaged device recited in claim 17 wherein said rubbery material comprises silicone rubber.

* * * * *